(12) United States Patent
Adams et al.

(10) Patent No.: US 7,063,992 B2
(45) Date of Patent: Jun. 20, 2006

(54) SEMICONDUCTOR SUBSTRATE SURFACE PREPARATION USING HIGH TEMPERATURE CONVECTION HEATING

(75) Inventors: Michael J. Adams, Olmsted Falls, OH (US); James Healy, Jr., Carnegie, PA (US); William H. Howland, Jr., Wexford, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 21 days.

(21) Appl. No.: 10/637,447

(22) Filed: Aug. 8, 2003

(65) Prior Publication Data

US 2005/0028836 A1  Feb. 10, 2005

(51) Int. Cl.
*H01L 21/66* (2006.01)

(52) U.S. Cl. ............................ 438/17; 438/14; 438/18; 438/928

(58) Field of Classification Search ................. 438/14, 438/17, 18, 974, 928; 219/400, 449.1
See application file for complete search history.

(56) References Cited

U.S. PATENT DOCUMENTS

| | | | |
|---|---|---|---|
| 4,794,217 A * | 12/1988 | Quan et al. ................. | 438/14 |
| 4,886,765 A | 12/1989 | Chen et al. | |
| 5,261,965 A | 11/1993 | Moslehi | |
| 5,306,671 A | 4/1994 | Ogawa et al. | |
| 5,470,799 A | 11/1995 | Itoh et al. | |
| 5,550,351 A | 8/1996 | DiPaolo et al. | |
| 5,556,479 A | 9/1996 | Bran | |
| 5,661,408 A | 8/1997 | Kamieniecki et al. | |
| 5,704,986 A | 1/1998 | Chen et al. | |
| 5,885,360 A | 3/1999 | Han et al. | |
| 6,254,689 B1 | 7/2001 | Meder | |
| 6,261,853 B1 | 7/2001 | Howell et al. | |
| 6,277,749 B1 | 8/2001 | Funabashi | |
| 6,303,397 B1 | 10/2001 | Chen et al. | |
| 6,306,564 B1 | 10/2001 | Mullee | |
| 6,325,078 B1 | 12/2001 | Kamieniecki | |
| 6,353,264 B1 | 3/2002 | Coronel et al. | |
| 6,528,427 B1 * | 3/2003 | Chebi et al. ................. | 438/694 |
| 6,783,630 B1 * | 8/2004 | Shajii et al. ............ | 156/345.53 |
| 2001/0020614 A1 | 9/2001 | Howell et al. | |

FOREIGN PATENT DOCUMENTS

EP           0423761 A2         4/1991

(Continued)

OTHER PUBLICATIONS

Wikipedia. "Mass production" (online). Aug. 28, 2005 [retrieved Sep. 12, 2005]. Retrieved from the Internet: <URL: http://en.wikipedia.org/wiki/Mass_production.*

*Primary Examiner*—Michael Trinh
*Assistant Examiner*—Christy Novacek
(74) *Attorney, Agent, or Firm*—The Webb Law Firm

(57) ABSTRACT

A method of processing a semiconductor wafer includes utilizing a heated gas to heat at least one part of a semiconductor wafer by convection whereupon at least one contaminant is desorbed therefrom. A stream of cooling gas is caused to pass over the one part of the semiconductor wafer in the absence of heated gas to cool the one part of the semiconductor wafer. A metrology tool is then caused to measure at least one part of the semiconductor wafer to determine at least one characteristic thereof.

11 Claims, 4 Drawing Sheets

FOREIGN PATENT DOCUMENTS

| | | |
|---|---|---|
| JP | 63129633 A | 6/1988 |
| JP | 02140926 A | 5/1990 |
| JP | 02267935 A | 11/1990 |
| JP | 03183132 A | 8/1991 |
| JP | 07037892 A | 2/1995 |
| JP | 7228989 | 8/1995 |
| JP | 10189487 A | 7/1998 |
| JP | 2000294529 | 10/2000 |

* cited by examiner

SEMICONDUCTOR SUBSTRATE SURFACE PREPARATION USING HIGH TEMPERATURE CONVECTION HEATING

BACKGROUND OF THE INVENTION

1. Field of the Invention

The present invention relates to semiconductor wafer processing and, more particularly, to desorption of one or more contaminants from a surface of a semiconductor wafer.

2. Description of Related Art

Semiconductor substrates, especially silicon wafers, can form a layer of surface contamination. This surface contamination is undesirable because it can adversely affect wafer processing and monitoring. This contamination comes from the local untreated atmosphere, which is typically a mixture of numerous gases and gaseous vapors. It is believed that these gases and vapors condensate on the surface of the wafer forming a liquid or semi-liquid film. Although the constituents of this contamination layer are not precisely known, it is believed that water is a primary component. The other contaminants are comprised mostly of various hydrocarbon molecules, which are collectively referred as organics.

One approach to removing the contamination layer is heating the wafer. Heretofore, heating a wafer has been accomplished by radiation or conduction. One radiation heating technique includes placing a wafer under a heating element and heating the topside of the wafer primarily through radiation. Practical radiation heating requires holding the heat source at temperatures significantly higher than the desired surface temperature. This heat can create undesirable temperature increases in the surrounding area which would necessitate additional thermal management techniques.

Since it is directly over the top surface of a wafer, a radiation heating element must be sealed and non-contaminating even at high temperatures. Sealing the element can reduce radiation effectiveness requiring even a higher temperature heat source. Materials that meet the non-contaminating requirements can also be expensive and hard to manufacture. An array of linear heating elements can create cool zones between the elements resulting in uneven heating of the wafer surface.

One conduction heating technique includes placing the wafer onto a heated surface, such as a hotplate. The wafer is then heated primarily through conduction from the backside of the wafer until the topside has reached a desired temperature. One problem with using a heating plate results from the use of robotic arms that transport the wafer by the backside thereof. Setting the wafer down onto the heated surface of the hotplate requires withdrawing of the robotic arm. A mechanical wafer lowering mechanism or a recessed pocket in the surface of the hotplate is usually required to accomplish this. A wafer lowering mechanism adds system complexity while a recessed pocket can create uneven wafer heating. Another problem with conduction heating is a possibility of contaminating the backside of the wafer by the hotplate itself.

It would, therefore, be desirable to provide an apparatus and method that avoids the foregoing problems, and others, while enabling the temperature of a semiconductor wafer to be raised sufficiently to facilitate desorption of contaminants thereon for subsequent testing thereof.

SUMMARY OF THE INVENTION

The invention is a method of desorbing one or more contaminants from a surface of a semiconductor wafer for measurement by a metrology tool. The method includes positioning a wafer in spaced parallel relation with the heating plate and heating the wafer by convection with gas heated by the heating plate for a predetermined time period to remove contaminants from the wafer surface. The wafer is then removed from spaced parallel relation with the heating plate and cooled by blowing a gas thereon. At least one characteristic of the wafer is measured with a metrology tool a predetermined time after wafer heating is complete.

The foregoing method can be repeated for a plurality of wafers. Each wafer can be positioned in spaced parallel relation between a pair of spaced parallel heating plates.

The invention is also a method of preparing a semiconductor wafer for measurement by a metrology tool. The method includes positioning the wafer in spaced parallel relation with a planar heating element and heating the wafer by convection with gas heated by the heating element for a predetermined heating time to remove contaminants from the wafer surface. The wafer is then removed from its spaced parallel relation with the heating plate and a stream of gas is caused to pass over a surface of the wafer for a predetermined cooling time thereby cooling the wafer. The wafer is then positioned in operative relation to a metrology tool and at least one characteristic of the wafer is measured with the metrology tool.

Lastly, the invention is a method of processing a semiconductor wafer. The method includes utilizing a heated gas to heat at least one part of a semiconductor wafer by convection whereupon at least one contaminant is desorbed therefrom. A stream of cooling gas is caused to pass over the one part of the semiconductor wafer in the absence of said heated gas to cool the one part of the semiconductor wafer. A metrology tool is then caused to measure the one part of the semiconductor wafer to determine at least one characteristic thereof.

DETAILED DESCRIPTION OF THE INVENTION

The present invention will be described with reference to the accompanying figures where like reference numbers correspond to like elements.

Figure 1:
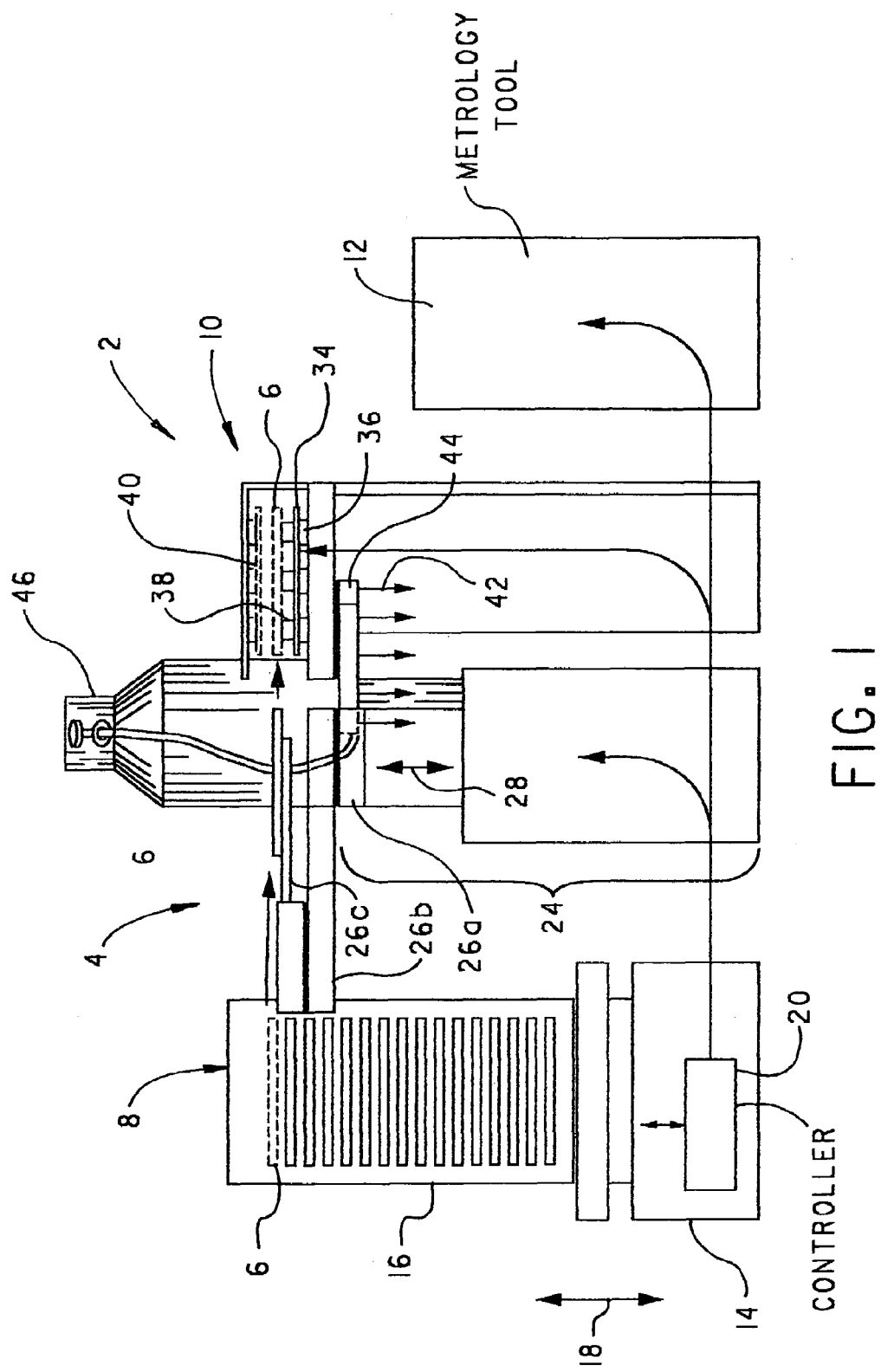
FIG. 1 is a side view of a system for desorbing and testing one or more semiconductor wafers.

With reference to FIG. 1, a system 2 for desorbing one or more contaminants from one or more surfaces of a semiconductor wafer includes a robotic arm assembly 4 for moving a semiconductor wafer 6 from an input/output station 8 to a desorption station 10. Once semiconductor wafer 6 has been desorbed in response to convection heating of semiconductor wafer 6 by desorption station 10, and semiconductor wafer 6 has been cooled to a suitable temperature for further testing, robotic arm assembly 4 transfers semiconductor wafer 6 to a metrology tool 12 for testing thereby. An exemplary metrology tool 12 can include a probe tip for contacting a surface of semiconductor wafer 6 and for applying a suitable electrical stimulus thereto. However, this is not to be construed as limiting the invention.

Examples of a suitable electrical stimulus include capacitance-voltage (CV), current-voltage (IV), conductance-voltage (GV) or capacitance-time (Ct) type electrical stimulus. Metrology tool 12 measures a response of semiconductor wafer 6 to the electrical stimulus and determines from the response at least one property of semiconductor wafer 6 at the point where the electrical stimulus is applied. Details regarding metrology tool 12 will not be described herein for simplicity of description. However, as will be appreciated by one of ordinary skill in the art, any suitable metrology tool 12 for determining a property of semiconductor wafer 6 can be utilized.

Figure 2:
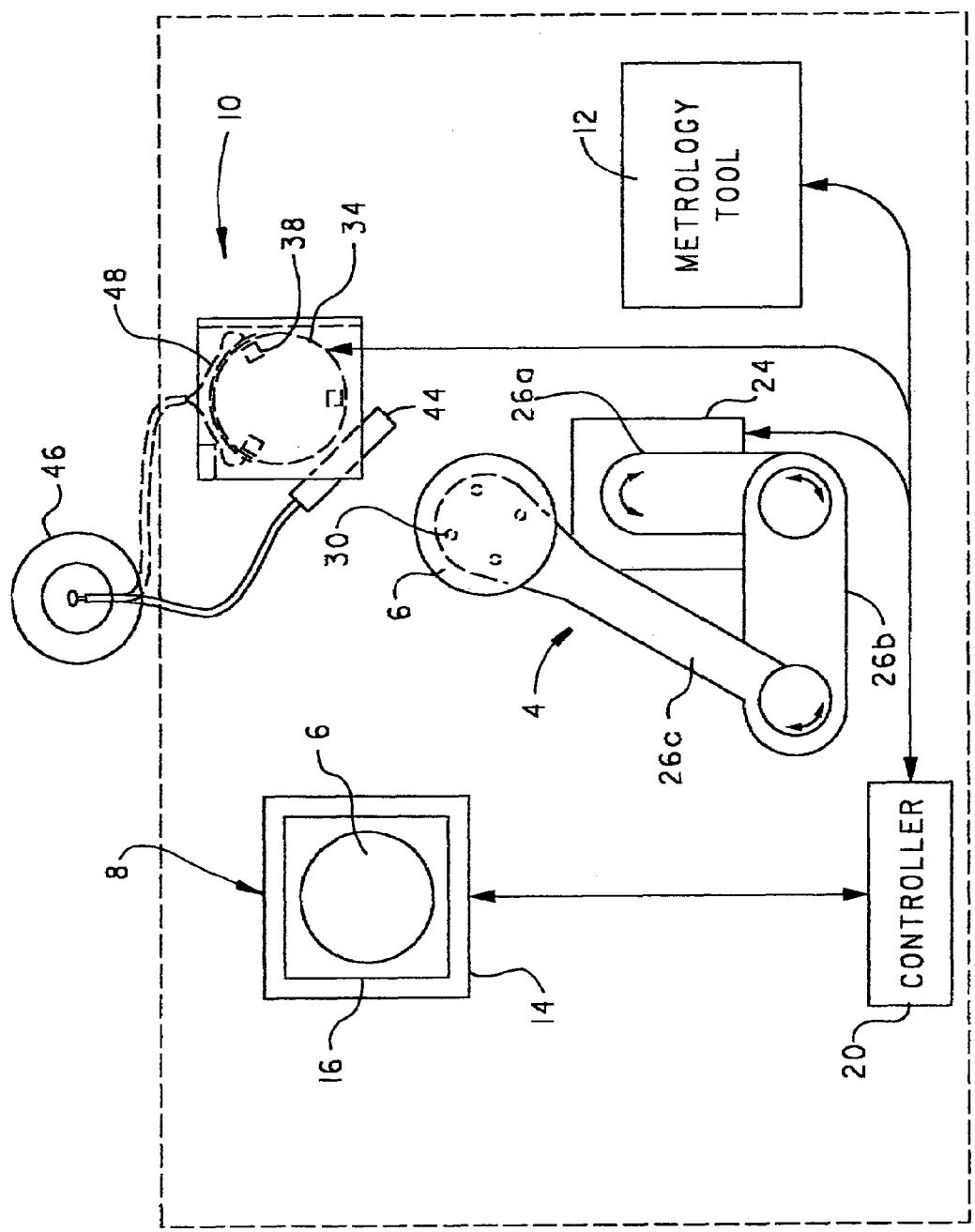
FIG. 2 is a top view of the system shown in FIG. 1.

With reference to FIG. 2 and with continuing reference to FIG. 1, input/output station 8 includes a base 14 for supporting a carrier 16 that is configured to carry one or more semiconductor wafers 6. Base 14 can be configured to move carrier 16 upwardly or downwardly, as shown by arrow 18 in FIG. 1, under the control of a controller 20.

Robotic arm assembly 4 includes a base 24 coupled to a plurality of arms 26a–26c. Base 24 can be configured to move arms 26a–26c upwardly or downwardly as shown by arrow 28 in FIG. 1. One end of arm 26a is rotatably coupled to base 24 while the other end of arm 26a is rotatably coupled to one end of arm 26b. The other end of arm 26b is rotatably coupled to one end of arm 26c. Desirably, arm 26c is in the form of a paddle having one or more vacuum holes 30 disposed therein adjacent the distal end thereof. Vacuum holes 30 are coupled to a source of vacuum (not shown) which can deliver a vacuum to vacuum holes 30 under the control of controller 20. As shown in the figures, semiconductor wafer 6 can be disposed on the distal end of arm 26c and held thereon by means of a vacuum supplied to vacuum holes 30.

Desorption station 10 includes a circular heating plate 34 having a diameter that is desirably no less than the diameter of semiconductor wafer 6. One desirable construction of heating plate 34 includes one or more thick film resistors formed on a circular ceramic substrate. Circular heating plates of this type are available from Watlow Electric Manufacturing Company, #6 Industrial Loop Road, P.O. Box 975, Hannibal, Mo., 63401, USA. However, this particular form of heating plate is not to be construed as limiting the invention.

Heating plate 34 is desirably spaced from a base of desorption station 10 by suitable standoffs 36. Additionally, standoffs 38 are arranged on a top surface of heating plate 34 for maintaining semiconductor wafer 6 in spaced parallel relation to heating plate 34 during desorption of one or more contaminants from semiconductor wafer 6. Standoffs 36 and 38 are desirably formed from a high-temperature glass-mica ceramic. However, this is not to be construed as limiting the invention since the use of any suitable high-temperature, non-contaminating material to form standoffs 36 and 38 is envisioned.

The height of each standoff 38 is selected whereupon the distal end of arm 26c can position semiconductor wafer 6 thereon whereafter the source of vacuum to vacuum hole 30 can be terminated, The distal end of arm 26c can then be moved from a position in contact with the backside of semiconductor wafer 6 to a position between semiconductor wafer 6 and circular heating plate 34. Once in this position, the distal end of arm 26c can be withdrawn from the space between semiconductor wafer 6 and heating plate 34 thereby facilitating heating of semiconductor wafer 6 by convection with gas heated by heating plate 34.

Electrical current can be supplied to heating plate 34 under the control of controller 20 whereupon the temperature of heating plate 34 can be controlled. Suitable temperature sensing means (not shown) can be positioned on or adjacent heating plate 34 and coupled to controller 20 to enable controller 20 to detect and control the temperature of heating plate 34. Also or alternatively, desorption station 10 can include a circular heating plate 40, shown in phantom in FIG. 1, disposed above standoffs 38. Electrical current can be supplied to heating plate 40 under the control of controller 20 for controlling the temperature of heating plate 40. Desirably, when heating plates 34 and 40, are provided the spacing therebetween is sufficient to enable semiconductor wafer 6 and the distal end of arm 26c to be received therebetween.

After semiconductor wafer 6 has been convection heated for a predetermined time period sufficient to desorb one or more contaminants from semiconductor wafer 6, the distal end of arm 26c can be reintroduced into the space between heating plate 34 and semiconductor wafer 6 under the control of controller 20. Thereafter, robotic arm assembly 4 can be controlled to raise arm 26 into contact with the backside of semiconductor wafer 6 whereupon a vacuum can be applied to vacuum holes 30 to secure semiconductor wafer 6 to the distal end of arm 26c. Robotic arm assembly 4 can then be controlled to lift semiconductor wafer 6 off standoffs 38 and to withdraw semiconductor wafer 6 from desorption station 10.

Figure 3:
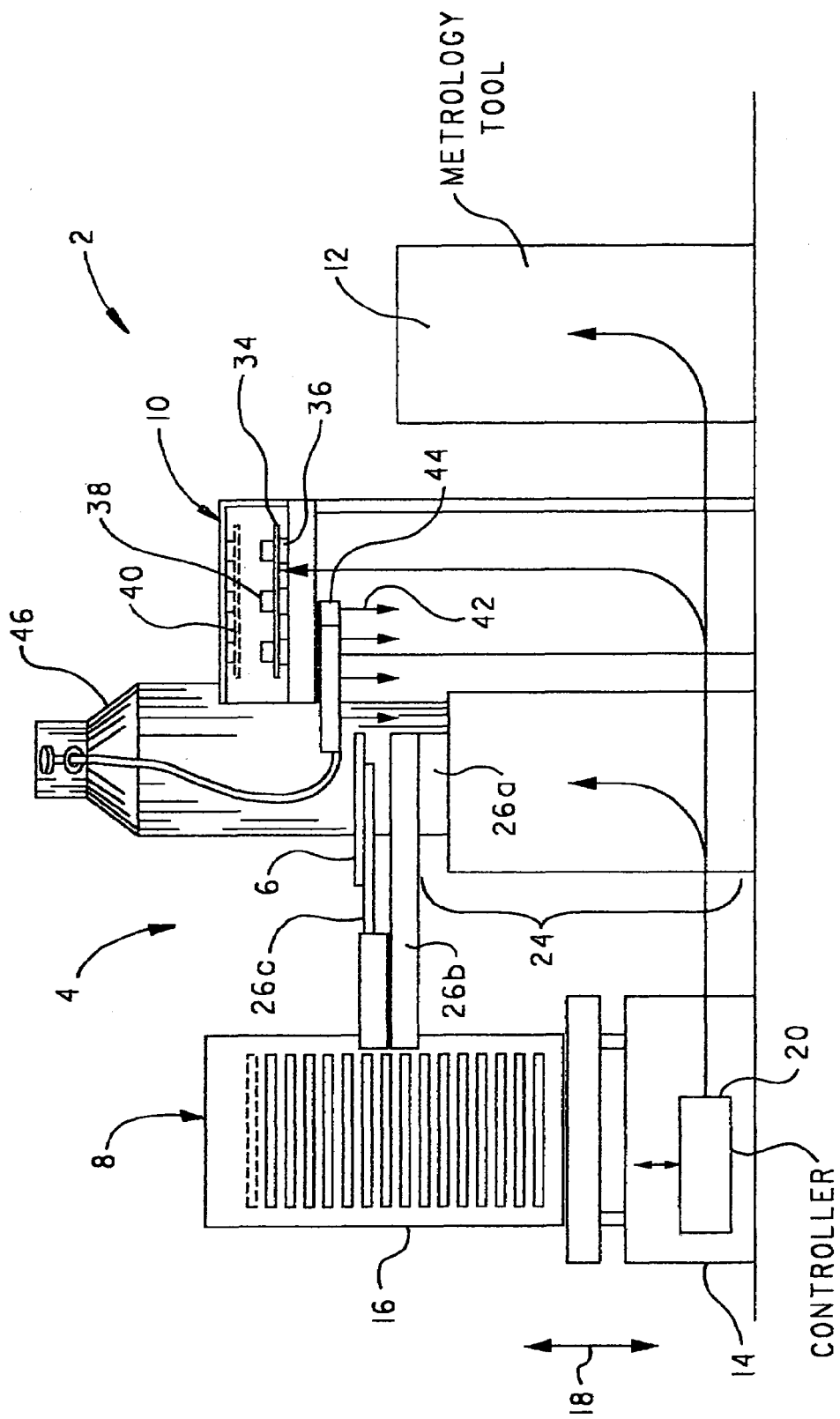
FIG. 3 is the system of FIG. 1 with the robotic arm assembly in a position for moving a desorbed semiconductor wafer through a stream of cooling gas.

With reference to FIG. 3 and with continuing reference to FIGS. 1 and 2, robotic arm assembly 4 is then controlled to move semiconductor wafer 6 through a stream of gas 42, desirably nitrogen, dispensed by a manifold 44 which receives said gas from a suitable gas source 46.

In the illustrated embodiment, manifold 44 is coupled to a bottom side of desorption station 10. However, this is not to be construed as limiting the invention since manifold 44 can be positioned at any convenient location accessible to robotic arm assembly 4.

The rate that robotic arm assembly 4 moves semiconductor wafer 6 through stream of gas 42 is selected whereupon semiconductor wafer 6 is cooled sufficiently for testing by metrology tool 12. To this end, if necessary, robotic arm assembly 4 can move semiconductor wafer 6 through stream of gas 42 a plurality of times. If desired, an on/off gas control valve (not shown) can be fluidly coupled to manifold 44 for on/off controlling stream of gas 42 under the control of controller 20.

Once semiconductor wafer 6 has been cooled sufficiently, robotic arm assembly 4 is controlled to deliver semiconductor wafer 6 to metrology tool 12 for testing. Once semiconductor wafer 6 is in a proper position for testing by metrology tool 12, controller 20 signals metrology tool 12 that testing of semiconductor wafer 6 can commence.

Desirably, metrology tool 12 commences testing semiconductor wafer 6 a predetermined time after convection heating of semiconductor wafer 6 by desorption station 10 is complete. By controlling the time between the end of convection heating of each semiconductor wafer 6 processed by desorption station 10 and the beginning of testing of said semiconductor wafer 6 with metrology tool 12, variations in testing results between two or more wafers due to exposure to the atmosphere after desorption is avoided.

Once testing of semiconductor wafer 6 is complete, metrology tool 12 signals controller 20. In response to receiving this signal from metrology tool 12, controller 20 controls robotic arm assembly 4 to remove semiconductor wafer 6 from metrology tool 12 and to return semiconductor wafer 6 to the same location in carrier 16 from which it was initially obtained. Thereafter, the vertical position of base 14 and robotic arm assembly 4 can be controlled to deliver the next semiconductor wafer 6 supported in carrier 16 to desorption station 10, stream of gas 42 and metrology tool 12 for testing and subsequent return to the same location in carrier 16 in the above-described manner. Desirably, the method of processing each semiconductor wafer 6 in carrier 16 continues until all of the semiconductor wafers 6 in carrier 16 have been processed in the above-described manner.

With specific reference to FIG. 2, conventional atmospheric gas, i.e., atmospheric air, can be utilized for convection heating of semiconductor wafer 6 in desorption station 10. However, if desired, semiconductor wafer 6 can be exposed to an atmosphere of a desirable gas, such as nitrogen, during desorption of semiconductor wafer 6 in desorption station 10. To this end, desorption station 10 can include a manifold 48 for delivering the suitable gas to semiconductor wafer 6 received in desorption station 10 from a suitable source of said gas, e.g., gas source 46.

In the above-described embodiment, heating plate 34 and/or heating plate 40 are described as having a diameter no less than the diameter of semiconductor wafer 6. However, if desired, the diameter of heating plate 34 and/or heating plate 40 can be smaller than the diameter of semiconductor wafer 6 whereupon only a portion of semiconductor wafer 6 is heated by convection with gas heated by such smaller diameter heating plate(s).

Figure 4:
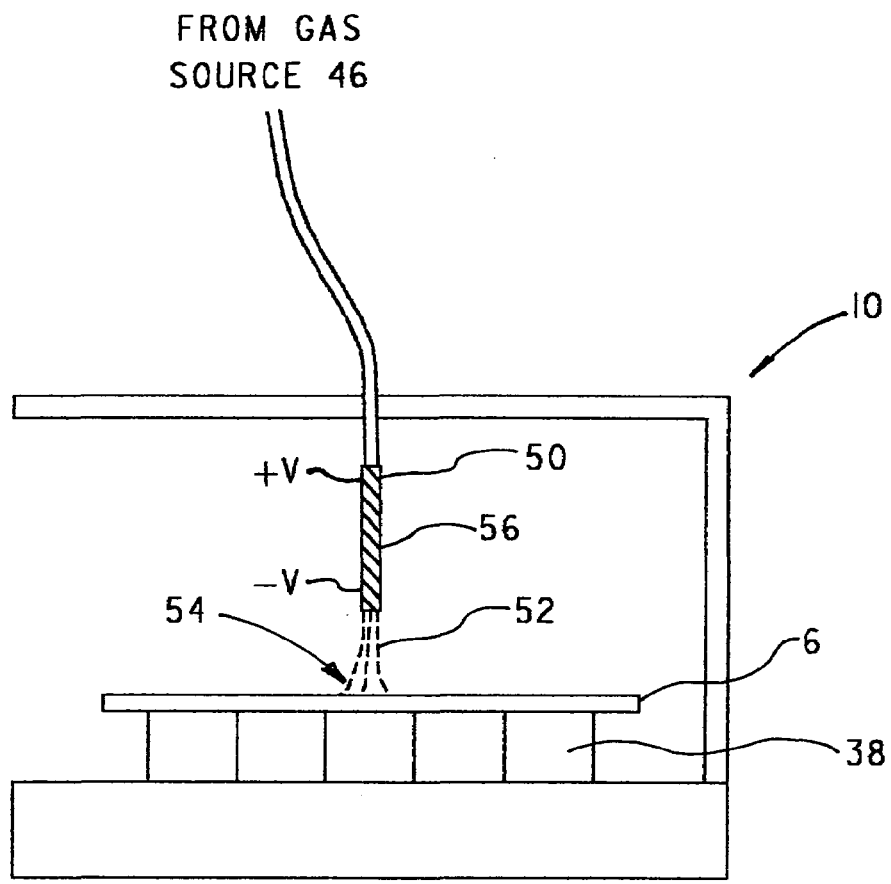
FIG. 4 is an isolated view of the desorption station of FIGS. 1 and 3 also or alternatively including a heated tube for delivering a heated gas to at least a portion of a semiconductor wafer.

With reference to FIG. 4, also or alternatively, desorption station 10 can include a tube 50 for directing a stream of gas 52 from a gas source, e.g., gas source 46, to at least one portion 54 of semiconductor wafer 6. Tube 50 includes a heating element 56 which is coupled to a suitable source of electric power for heating tube 50 and, in turn, heating the gas flowing therethrough. Stream of gas 52 thus heated can heat portion 54 of semiconductor wafer 6 by convection. Tube 50 and heating element 56 are desirably configured to co-act whereupon the temperature of heated gas 52 is sufficient for desorbing at least one contaminant from portion 54 of semiconductor wafer 6.

Once portion 54 of semiconductor wafer 6 has been desorbed, semiconductor wafer 6 can be exposed to a stream of cooling gas for cooling at least portion 54 thereof. This stream of cooling gas can be supplied to semiconductor wafer 6 via manifold 44 in the manner described above. Alternatively, the stream of cooling gas can be supplied via tube 50 simply by disconnecting heating element 54 from its source of electrical power whereupon stream of gas 52 which is no longer heated by heating element 56 can be utilized to cool portion 54 of semiconductor wafer 6.

Once portion 52 of semiconductor wafer 6 is cooled sufficiently, semiconductor wafer 6 is delivered to metrology tool 12 for testing at least portion 54 thereof. Thereafter, semiconductor wafer 6 is removed from metrology tool 12 and returned to carrier 16.

As can be seen, one or more contaminants on a surface of semiconductor wafer 6 can be desorbed in an efficient and predictable manner whereupon reliable testing of semiconductor wafer 6 by metrology tool 12 can be accomplished. The ability to heat the semiconductor wafer 6 by convection avoids possible contamination of the semiconductor wafer 6 resulting from contact between a heating element and semiconductor wafer 6 during conductive heating thereof and avoids the need for sealed radiation heating elements for radiation heating of semiconductor wafer 6. Lastly, the ability to convectively heat a portion of semiconductor wafer 6 by blowing a heated gas thereon enables desorption of said portion while avoiding the need to heat the remainder of the semiconductor wafer 6 to a desorption temperature. Thereafter, the desorbed portion of semiconductor wafer 6 can be tested independently of the remainder of the semiconductor wafer 6. It is envisioned that the ability to selectively heat one or more portions of a semiconductor wafer by convection will enable metrological testing of product semiconductor wafers utilizing conventional metrology tools.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of desorbing one or more contaminants from a surface of a semiconductor wafer for measurement by a metrology tool, the method comprising:
    (a) positioning a wafer in spaced parallel relation with a heating plate;
    (b) heating the wafer by convection with gas heated by the heating plate for a predetermined time period to remove contaminants from the wafer surface;
    (c) moving the wafer from the position it occupied while being heated in step (b);
    (d) following step (c), cooling the wafer by blowing a gas thereon; and
    (e) measuring at least one characteristic of the wafer with a metrology tool by application of an electrical stimulus to the wafer a predetermined time after expiration of the predetermined time period in step (b).

2. The method of claim 1, wherein steps (a)–(e) are repeated for a plurality of wafers.

3. The method of claim 1, wherein step (a) includes positioning the wafer in spaced parallel relation between a pair of spaced parallel heating plates.

4. A method of preparing a semiconductor wafer for measurement by a metrology tool, the method comprising:
    (a) positioning a wafer in spaced parallel relation with a planar heater element;
    (b) heating the wafer by convection with gas heated by the heater element for a predetermined heating time to remove contaminants from the wafer surface;
    (c) moving the wafer from the position it occupied while being heated in step (b);
    (d) following step (c), causing a stream of moving gas to pass over a surface of the wafer for a predetermined cooling time thereby cooling the wafer;
    (e) positioning the wafer in operative relation to a metrology tool; and
    (f) measuring at least one characteristic of the wafer with the metrology tool by application of an electrical stimulus to the wafer.

5. The method of claim 4, wherein step (a) includes positioning the wafer in spaced parallel relation between a pair of spaced heating elements.

6. The method of claim 4, wherein steps (a)–(f) are repeated for a plurality of wafers.

7. The method of claim 6, wherein the time between the end of step (d) and the beginning of step (f) is the same for each wafer.

8. The method of claim 6, wherein the time between the end of step (b) and the beginning of step (d) is the same for each wafer.

9. A method of processing a semiconductor wafer comprising:

(a) directing a stream of heated gas to a portion of one surface but not all of said surface of a semiconductor wafer whereupon at least one contaminant is desorbed therefrom by convection;

(b) directing a stream of cooling gas to said portion of the semiconductor wafer in the absence of said heated gas to cool said portion of the semiconductor wafer; and (c) applying an electrical stimulus to the semiconductor wafer by a metrology tool to measure said portion of the semiconductor wafer to determine at least one characteristic thereof.

10. The method of claim 9, wherein steps (a)–(c) are repeated for a plurality of wafers.

11. The method of claim 10, wherein the time between the end of step (a) and the beginning of step (c) is the same for each wafer.

* * * * *